(12) United States Patent
Cusin et al.

(10) Patent No.: US 8,502,624 B2
(45) Date of Patent: Aug. 6, 2013

(54) THERMOCOMPENSATED MECHANICAL RESONATOR

(75) Inventors: Pierre Cusin, Villars-Burquin (CH); Andrés Cabezas Jurin, Yverdon (CH)

(73) Assignee: ETA SA Manufacture Horlogère Suisse, Grenchen (CH)

( * ) Notice: Subject to any disclaimer, the term of this patent is extended or adjusted under 35 U.S.C. 154(b) by 322 days.

(21) Appl. No.: 12/856,219

(22) Filed: Aug. 13, 2010

(65) Prior Publication Data

US 2011/0037537 A1 Feb. 17, 2011

(30) Foreign Application Priority Data

Aug. 13, 2009 (EP) ..................................... 09167805

(51) Int. Cl.
*H03H 9/15* (2006.01)
*G04B 17/04* (2006.01)

(52) U.S. Cl.
USPC .......................................... 333/186; 368/175

(58) Field of Classification Search
USPC .................. 333/186; 368/168, 171, 175, 177
See application file for complete search history.

(56) References Cited

U.S. PATENT DOCUMENTS

| 7,344,302 | B2* | 3/2008 | Musy et al. | 368/175 |
| 7,682,068 | B2* | 3/2010 | Bourgeois | 368/169 |
| 8,348,497 | B2* | 1/2013 | Daout | 368/175 |
| 2008/0204173 | A1* | 8/2008 | Melamud et al. | 333/234 |
| 2010/0290320 | A1* | 11/2010 | Gygax et al. | 368/177 |

FOREIGN PATENT DOCUMENTS

| EP | 0 732 635 A1 | 9/1996 |
| EP | 1 422 436 A1 | 5/2004 |
| EP | 1 791 039 A1 | 5/2007 |
| WO | 2009/068091 A1 | 6/2009 |

OTHER PUBLICATIONS

European Search Report issued in corresponding application No. EP 0 916 7805, completed Jan. 15, 2010.

* cited by examiner

*Primary Examiner* — Dean O Takaoka
(74) *Attorney, Agent, or Firm* — Griffin & Szipl, P.C.

(57) ABSTRACT

The invention relates to a thermocompensated mechanical resonator including a strip whose core, which is of polygonal section, includes single crystal silicon. According to the invention, one or a number of faces of the core has a coating for making the resonator less sensitive to temperature variations. The invention concerns the field of timepieces.

22 Claims, 14 Drawing Sheets

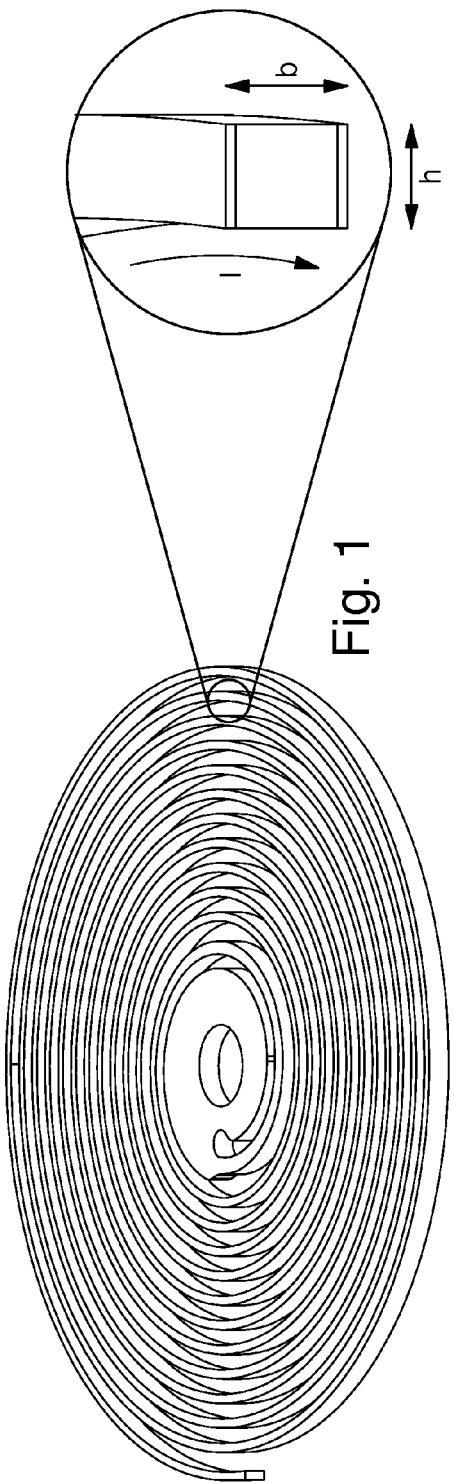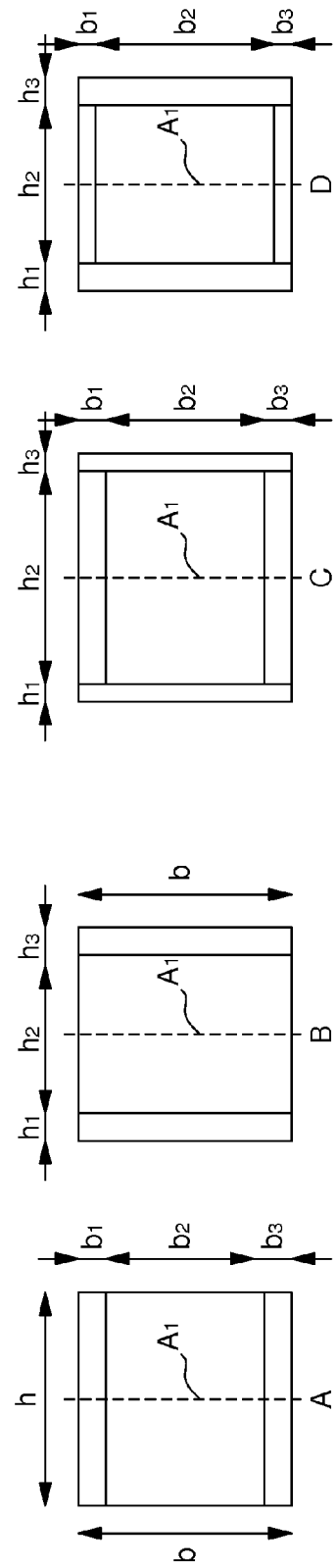

THERMOCOMPENSATED MECHANICAL RESONATOR

This application claims priority from European Patent Application No. 09167805.2 filed Aug. 13, 2009, the entire disclosure of which is incorporated herein by reference.

FIELD OF THE INVENTION

The invention relates to a thermocompensated mechanical resonator and, more specifically, a resonator of this type that includes a balance spring or hairspring made of thermocompensated single crystal silicon.

BACKGROUND OF THE INVENTION

EP Patent No. 1 422 436 discloses a balance spring whose core is made of single crystal silicon, which is coated with a silicon dioxide coating so as to thermally compensate said balance spring. It also minimises variation in the thermoelastic coefficient as a function of temperature. However, the document only discloses a coating of equal thickness, which may be difficult to adapt it to a balance in order to obtain a resonator with minimum variation of rate.

SUMMARY OF THE INVENTION

It is an object of the present invention to overcome all or part of the aforecited drawbacks by proposing a resonator that offers greater freedom as regards formation of the coating that makes thermal compensation possible.

The invention thus relates to a thermocompensated mechanical resonator including a strip, whose core, which is of polygonal section, includes single crystal silicon, characterized in that, at least on one of the faces, the core has a coating that makes said resonator less sensitive to temperature variations and, on at least one other surface, there is no coating, or characterized in that at least two adjacent surfaces of the core are not coated with the same thickness.

According to other advantageous features of the invention:
- the cross section of the strip is a quadrilateral comprising identical pairs of faces;
- said coating is deposited with priority given to the faces parallel to the bending plane of the strip, so as to improve quantitatively the influence on said resonator frequency or, conversely, to the perpendicular surfaces, so as to change said resonator frequency with less influence compared to deposition on the parallel surfaces;
- the strip is wound around itself, forming at least one coil, and coupled with an inertia flywheel. It forms a MEMS or at least two symmetrically assembled bars to make a tuning fork;
- the coating includes silicon dioxide;
- the core is made from a {100} or {111} single crystal silicon wafer;
- the coating thickness along the {100} or {111} plane of said pairs of faces approximately follow the relation:

$$Y = A \cdot X^3 + B \cdot X^2 + C \cdot X + D$$

where:
- Y is the percentage of coating thickness on the faces parallel to the bending axis ($A_1$) of the strip relative to the total strip height (h);
- X is the percentage of coating thickness on the faces perpendicular to the bending axis ($A_1$) of the strip relative to the total base (b) of the strip;
- A is the cubic coefficient of the polynomial estimate of the characteristic curve, which is $-3.5302 \cdot 10^{-5}$ or $-3.5565 \cdot 10^{-5}$;
- B is the quadratic coefficient of the polynomial estimate of the characteristic curve, which is $-1.114 \cdot 10^{-3}$ or $-1.0642 \cdot 10^{-3}$;
- C is the linear coefficient of the polynomial estimate of the characteristic curve, which is $-0.29152$ or $-0.28721$;
- D is the unit of the polynomial estimate of the characteristic curve, which is $15.522$ or $16.446$.

The invention relates to a timepiece that includes at least one resonator according to one of the aforecited variants.

BRIEF DESCRIPTION OF THE DRAWINGS

Other features and advantages will appear clearly in the following description, given by way of non-limiting illustration, with reference to the annexed drawings, in which:

FIG. 1 is a general perspective diagram of a balance spring;

FIG. 2 is a representative section of the balance spring of FIG. 1;

FIG. 3 is a diagram of several embodiments in accordance with the invention;

DETAILED DESCRIPTION OF PREFERRED EMBODIMENTS

The invention relates to a mechanical resonator, which may be of the sprung balance, tuning fork or more generally MEMS (micro electro mechanical system) type.

Figure 18:
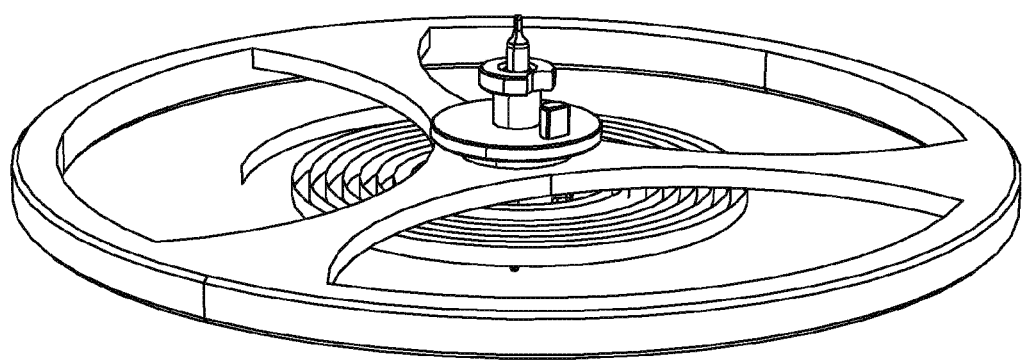
FIG. 18 is a strip wound around itself to form at least one coil that is coupled to an inertia fly wheel.

However, to explain the invention, as illustrated in FIGS. 1 and 2 and 18, we are using the application to a balance spring that cooperates with a balance to form said mechanical resonator. The balance spring is generally formed by a strip wound into at least one coil of length l and whose section has a base b and a height h.

As illustrated in FIG. 1, the strip is preferably formed in a single piece with its collet. Preferably, this is made possible by the use of a single crystal silicon wafer, whose thickness approximately matches the size of base b. The wafer is etched throughout in the shape of the balance spring and its collet via a deep reactive ion etching (DRIE).

As illustrated in FIG. 2, it can be seen that the total size of base b is made up of the single crystal silicon, but also two opposite coatings preferably made of amorphous silicon dioxide ($SiO_2$). This first embodiment is better shown in FIG. 3 above the reference A. FIG. 3 also shows the dotted line named $A_1$, which represents the bending axis of the strip. Thus, in the first embodiment A, only the faces of the strip that are perpendicular to bending axis $A_1$ are coated with a coating of respective thickness $b_1$ and $b_3$. It is thus clear that the total size b of the base is formed by these coatings $b_1$ and $b_3$, and size $b_2$ of the single crystal silicon part.

In the second embodiment B of FIG. 3, only the faces of the strip which are parallel to bending axis $A_1$ are coated with a coating of respective thickness $h_1$ and $h_3$. It is thus clear that the total size h of the height is formed by these coatings $h_1$ and $h_3$, and size $h_2$ of the single crystal silicon part.

In the third embodiment C of FIG. 3, all of the faces of the strip are coated with a coating. The adjacent faces of the strip are not coated in the same way and, preferably, are in identical pairs. Thus, the faces that are parallel to bending axis $A_1$ are coated with a coating of respective thickness $h_1$ and $h_3$ and those that are perpendicular to bending axis $A_1$ are coated with a coating of respective thickness $b_1$ and $b_3$. It is thus clear that, on the one hand, the total size h of the height is formed by coatings $h_1$ and $h_3$, and size $h_2$ of the single crystal silicon part and, on the other hand, the total size b of the base is thus formed by coatings $b_1$ and $b_3$, and size $b_2$ of the single crystal silicon part. It is clear that sizes $h_1$, $h_3$ are smaller than sizes $b_1$, $b_3$.

In the fourth embodiment D of FIG. 3, all of the faces of the strip are coated with a coating in a similar manner to third embodiment C. The adjacent faces of the strip are not coated in the same way and are preferably in identical pairs. Unlike third embodiment C, sizes $h_1$, $h_3$ are larger than sizes $b_1$, $b_3$.

Figure 5:
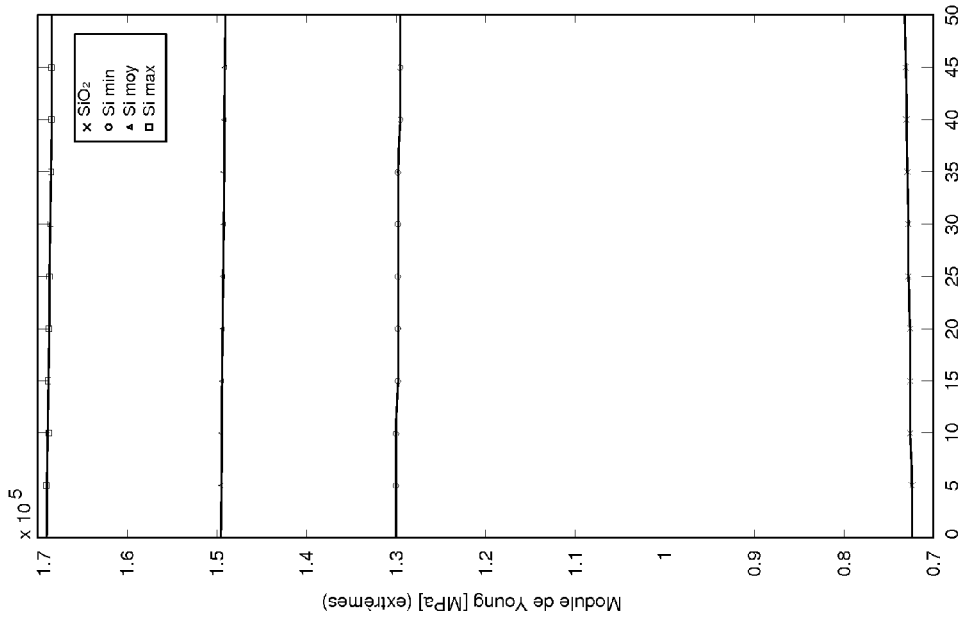
FIG. 5 is a diagram of the Young's modulus variation of the {100} plane of a single crystal silicon as a function of its temperature.
Figure 4:
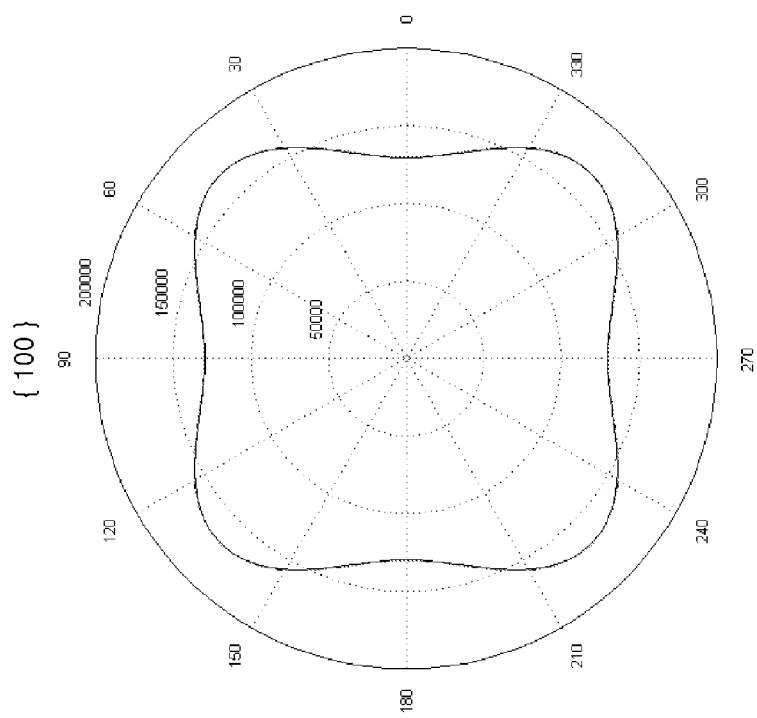
FIG. 4 is a spatial diagram of the Young's modulus of the {100} plane of a single crystal silicon as a function of its orientation.

According to the invention, the four embodiments, A, B, C and D were studied using a strip formed in a single crystal silicon wafer cut along planes {100} and {111}. The example illustrated in FIG. 4 shows a spatial diagram of the Young's modulus of the {100} plane of single crystal silicon as a function of its orientation. It is thus clear that elasticity is variable depending upon the orientation of bending of the strip. However, after performing calculations, we see that the construction of the spiral strip in fact behaves as if it had a medium Young's modulus ($\Delta Si_{moy}$) as illustrated in FIG. 5. This Figure also shows that the thermoelastic coefficient of single crystal silicon is negative (see marks □, ○, ∆) whereas the thermoelastic coefficient of amorphous silicon dioxide ($SiO_2$) is positive (see mark x).

Figure 7:
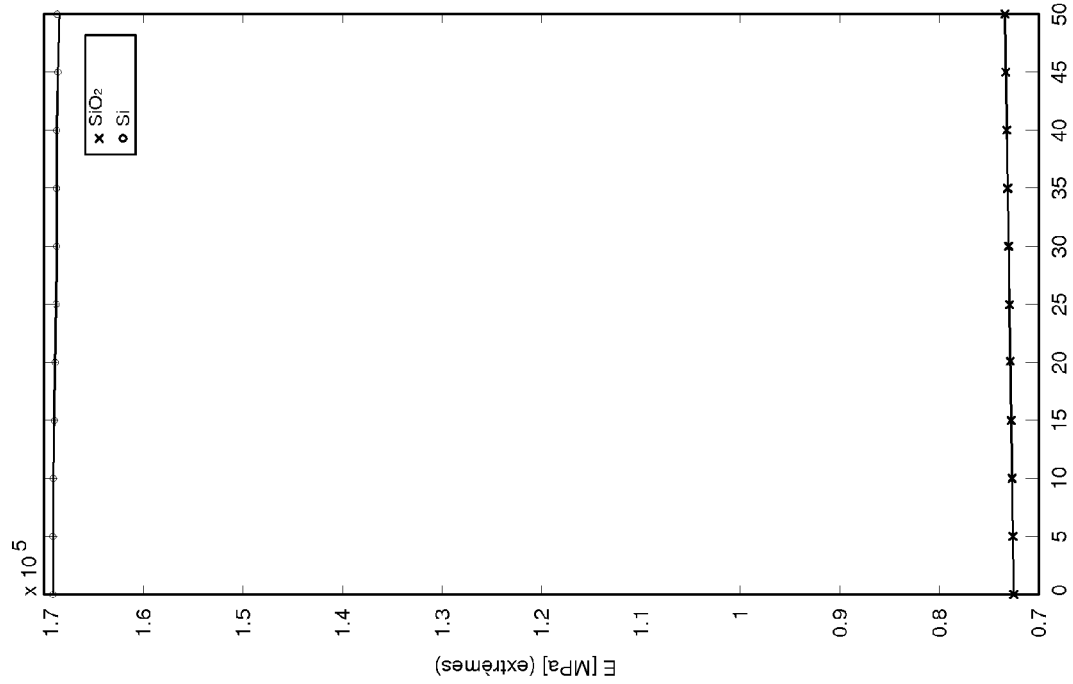
FIG. 7 is a diagram of the Young's modulus variation of the {111} plane of a single crystal silicon as a function of its temperature.
Figure 6:
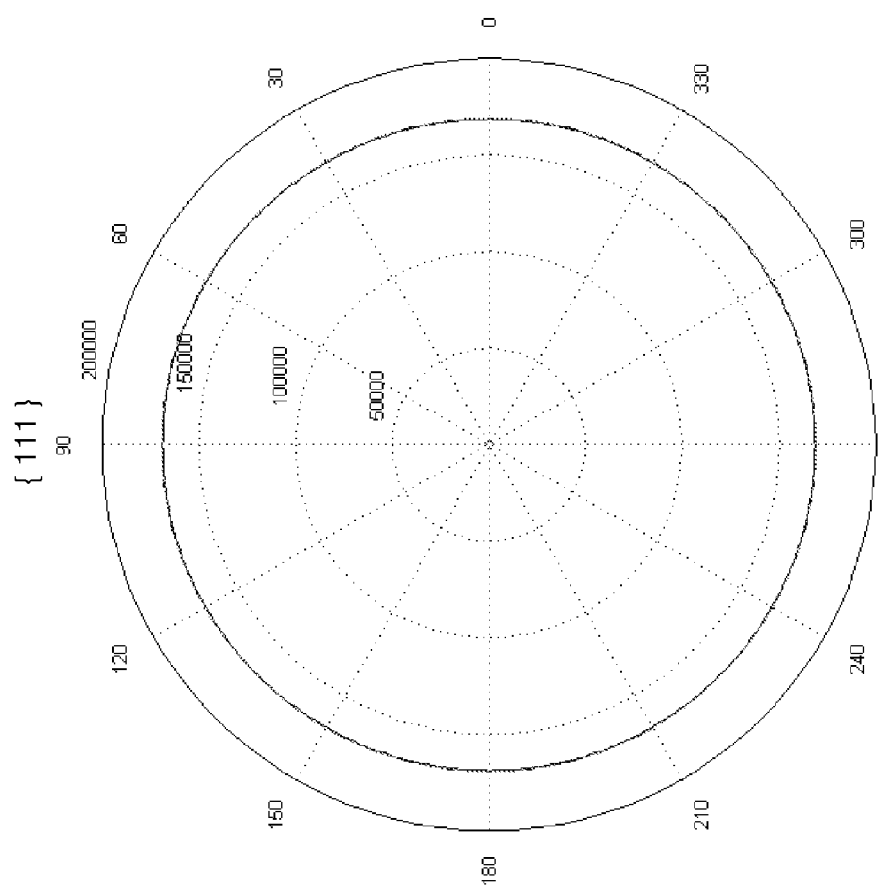
FIG. 6 is a spatial diagram of the Young's modulus of the {111} plane of a single crystal silicon as a function of its orientation.

Thus, upon studying FIGS. 6 and 7, which are similar respectively to FIGS. 4 and 5, but concern the {111} plane, it can be seen that apart from the higher Young's modulus value, the strip formed from the {111} plane reacts in a similar way to that formed from the {100} plane, i.e. it can be compensated by an amorphous silicon dioxide coating ($SiO_2$).

Figure 8:
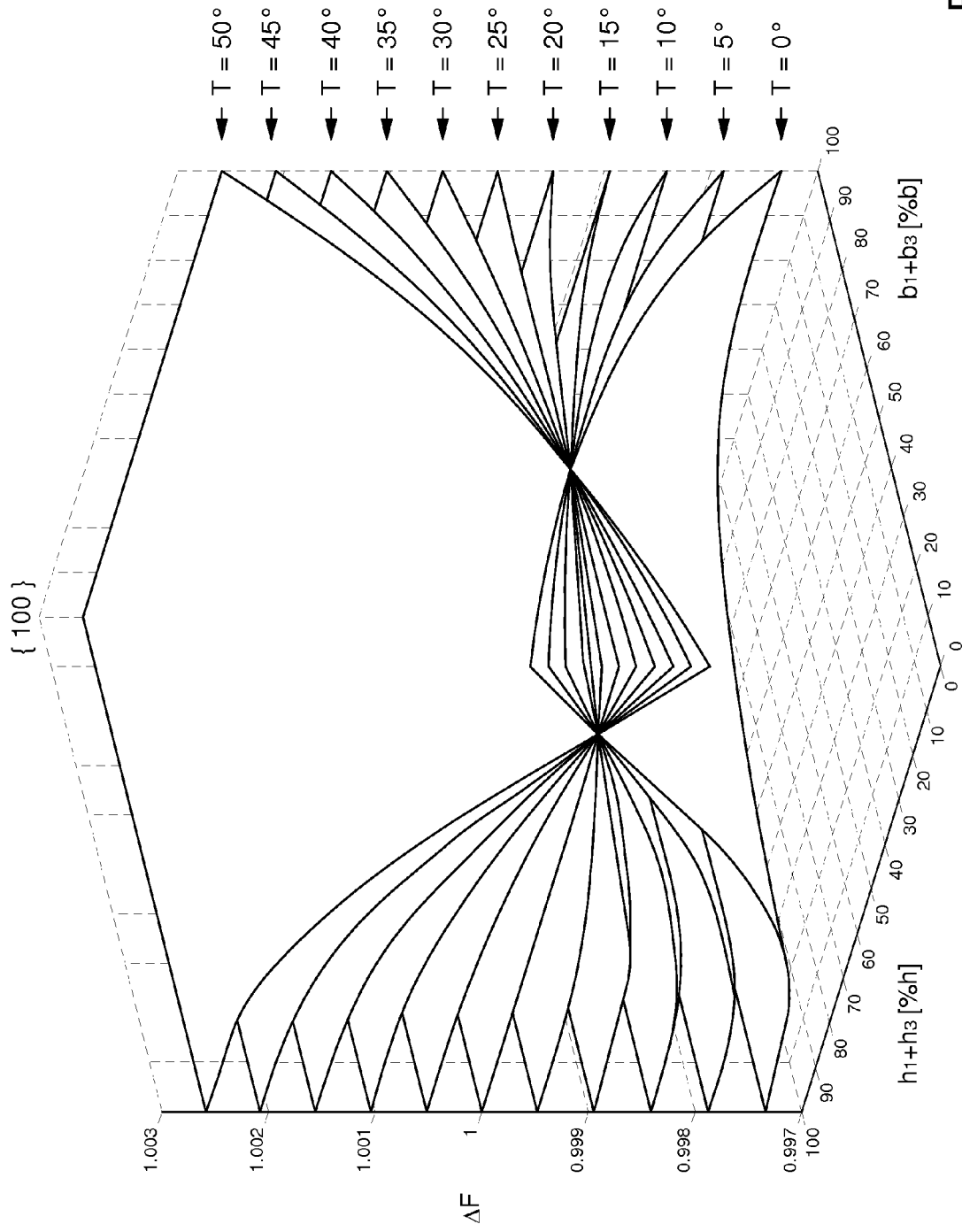
FIG. 8 is a diagram of the frequency variation of a resonator whose core is derived from the {100} plane of a single crystal silicon as a function of its temperature and coating thicknesses.

FIG. 8 is a complete representation of the calculations carried out for a strip formed in a single crystal silicon wafer cut along the {100} plane. FIG. 8 shows the frequency variation of the resonator whose strip is derived from {100} single crystal silicon as a function of temperature and coating thicknesses. It can be seen that there is a convergence curve between the various thermal planes that give an approximately constant ratio ΔF, i.e. equal to 1. To illustrate the characteristic curves more clearly, the following plans are given: a vertical plan of a part of FIG. 8 in the direction of axis $b_1+b_3$ [%b], i.e. %h=0 (FIG. 9), another in the direction of axis $h_1+h_3$ [%h], i.e. %b=0 (FIG. 10), then finally, a horizontal plan of FIG. 8 in the direction ΔF=1 (FIG. 11) have been formed.

Figure 9:
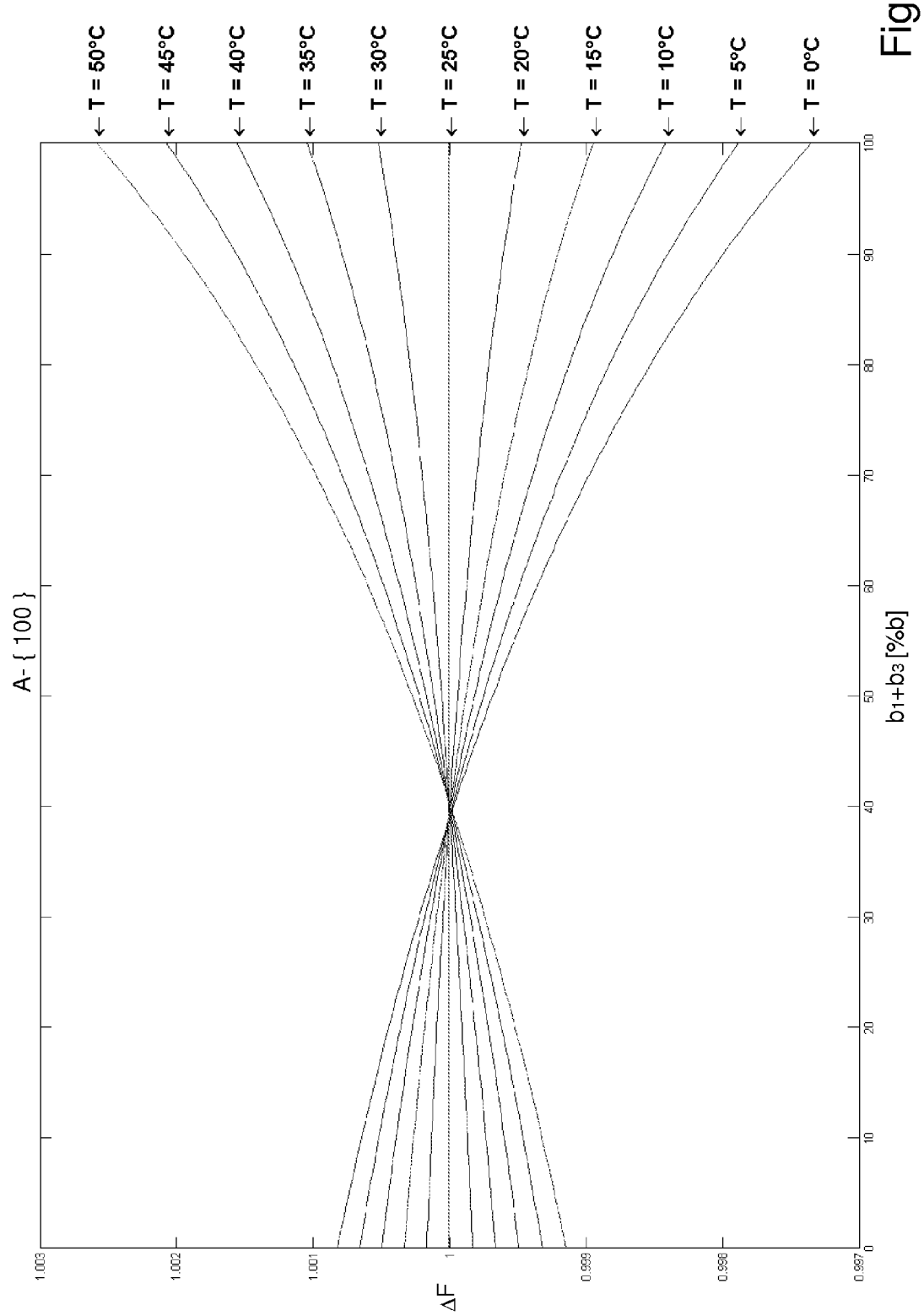
FIG. 9 is a vertical diagram of a part of FIG. 8 in the direction of axis $b_1+b_3$ [%b]

FIG. 9, which is actually the thermocompensation curve of first embodiment A of FIG. 3, shows that the thermal curves converge on the 25° C. curve at percentage $b_1+b_3$ relative to b between approximately 39 and 41%. For our preferred case wherein each opposite face follows the relation $b_1=b_3$, we therefore have, for the first embodiment A, a coating thickness for each of the two faces of between 19.5 and 20.5%. After a more detailed calculation, value $b_1+b_3$ is estimated at around 39.65%.

Figure 10:
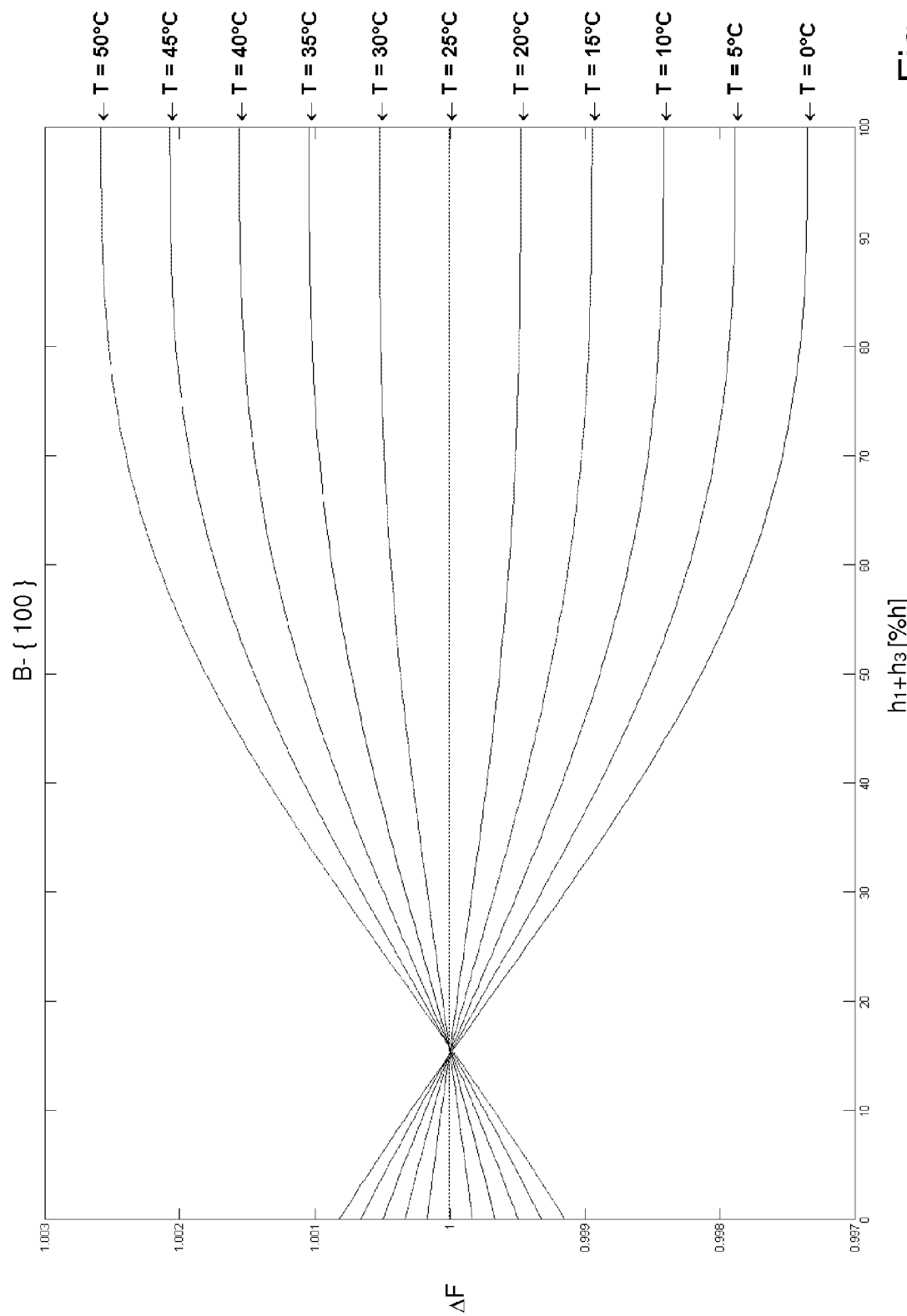
FIG. 10 is a vertical diagram of a part of FIG. 8 in the direction of axis $h_1+h_3$ [%h]

Similarly, with reference to FIG. 10, which is the thermocompensation curve of the second embodiment B of FIG. 3, it can be seen that the thermal curves converge on the 25° C. curve at percentage $h_1+h_3$ with respect to h which is substantially comprised between 15 and 16%. We therefore have, for our preferred case wherein each opposite force respects the relation $h_1=h_3$ for second embodiment B, a coating thickness for each of the two faces of between 7.5 and 8%. After a more detailed calculation, value $h_1+h_3$ is estimated at around 15.49%.

Figure 11:
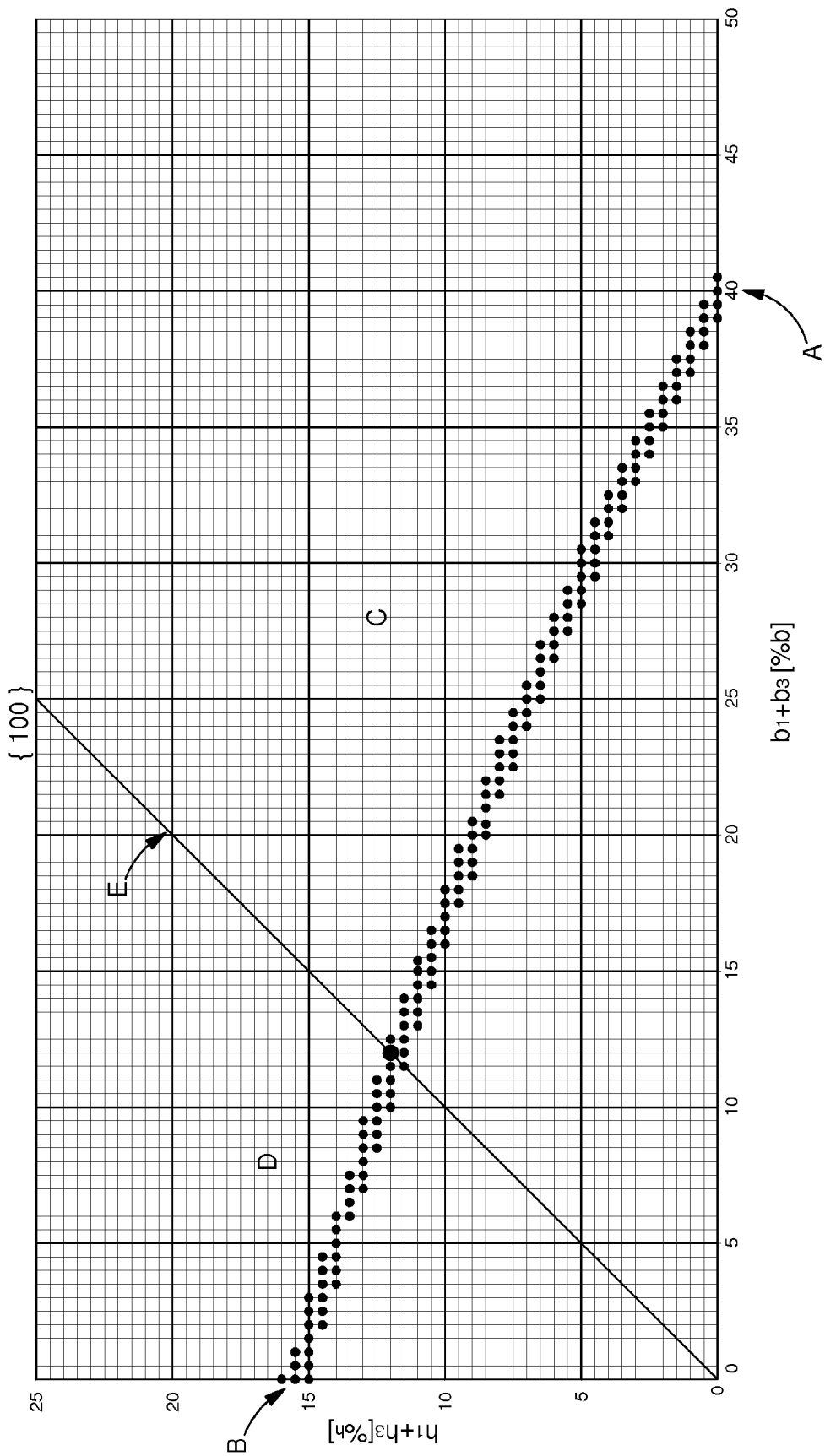
FIG. 11 is a horizontal diagram of a part of FIG. 8 in the direction $\Delta F=1$.

FIG. 11 summarizes the curve to be observed to compensate a strip formed of a single crystal silicon wafer cut along the {100} plane with amorphous silicon dioxide ($SiO_2$) coatings. Thus, the values of first and second embodiments A and B are found again respectively on the x and y axes. Moreover, the annotated curve E is also seen, for which the same percentage is applied across all of the strip faces, i.e. as in EP Patent No. 1 422 436. Finally, it can be seen that the characteristic curve between point B and curve E belongs to the fourth embodiment D of FIG. 3 and, between curve E and point A, to the third embodiment C of FIG. 3.

To simplify determination of the layers to be formed, a cubic polynomial was calculated to make it easier to develop the resonator:

$$Y = A \cdot X^3 + B \cdot X^2 + C \cdot X + D$$

Where:
  Y is the percentage of coating thickness ($h_1+h_3$) on the faces parallel to the strip bending axis ($A_1$) relative to the total strip height (h);
  X is the percentage of coating thickness ($b_1+b_3$) on the faces perpendicular to the strip bending axis ($A_1$) relative to the total base (b) of the strip;
  A is the cubic coefficient of the polynomial estimate of the characteristic curve which is $-3.5302 \cdot 10^{-5}$;
  B is the quadratic coefficient of the polynomial estimate of the characteristic curve which is $-1.114 \cdot 10^{-3}$;
  C is the linear coefficient of the polynomial estimate of the characteristic curve which is $-0.29152$;
  D is the unit of the polynomial estimate of the characteristic curve which is $15.522$.

Figure 12:
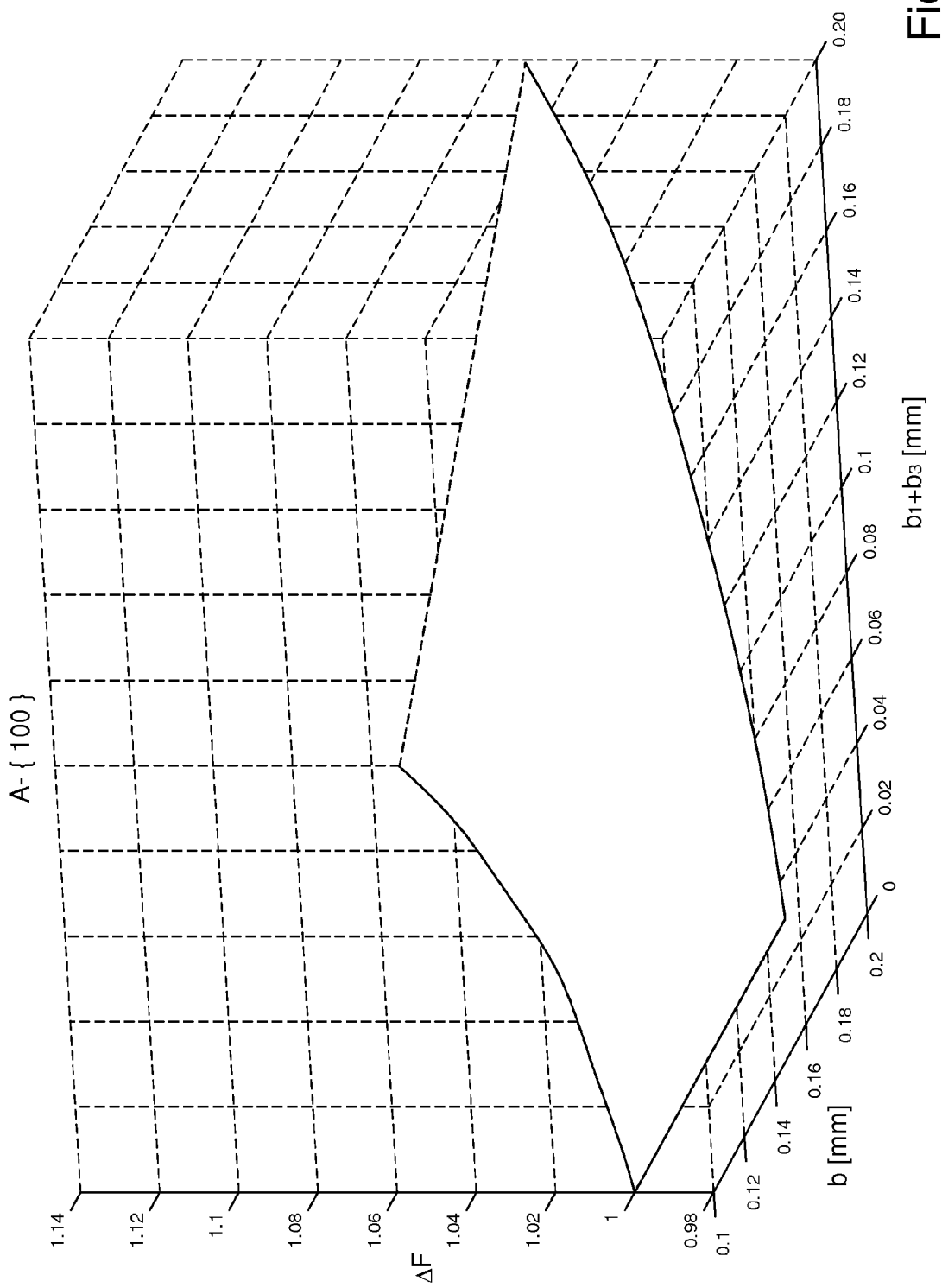
FIGS. 12 and 13 are diagrams of the resonator frequency variation as a function of the location and thickness of the coating.
Figure 13:
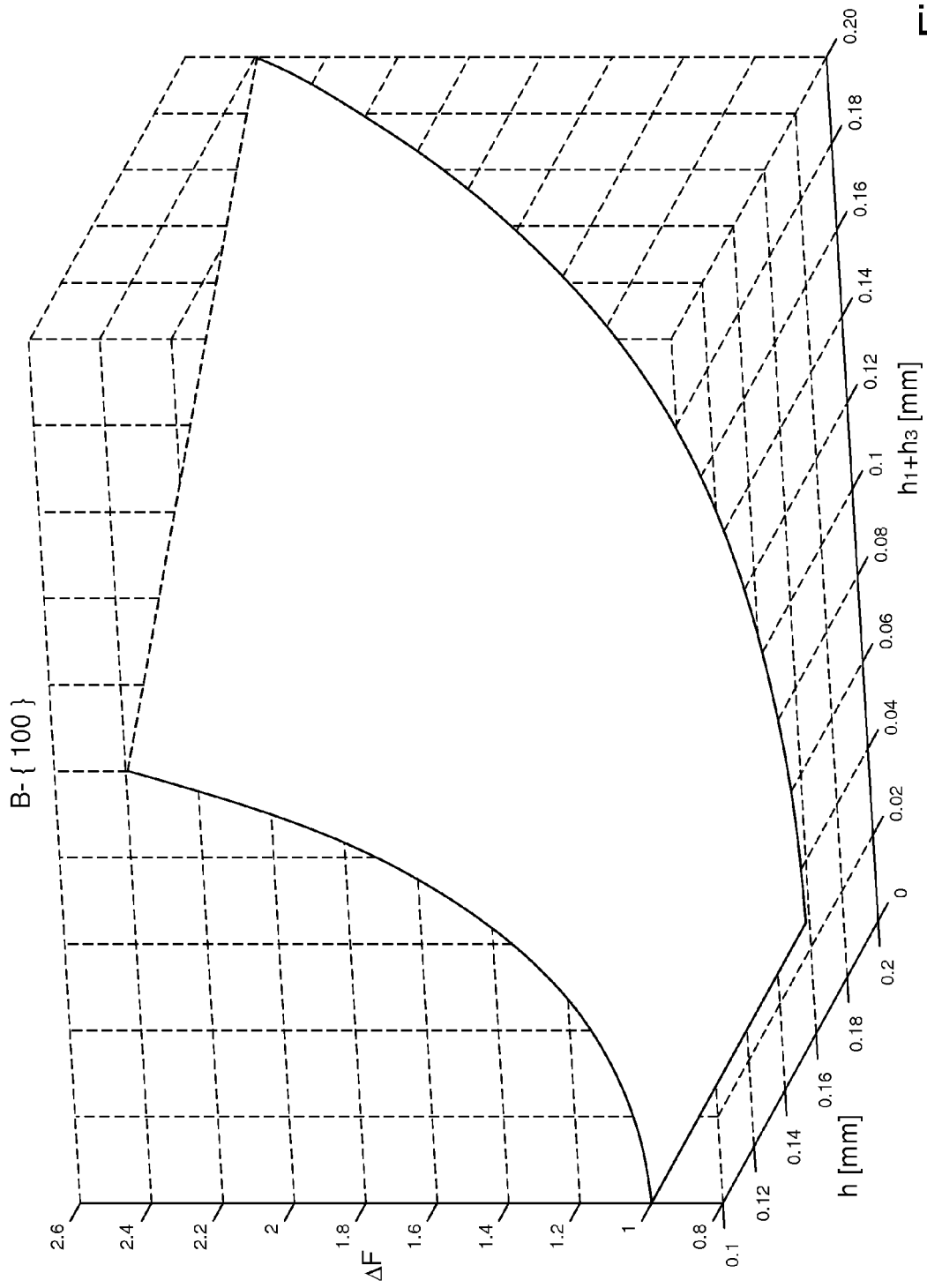

Finally, FIGS. 12 and 13 respectively show, in theory, the influence on the resonator frequency depending upon whether the coatings cover the faces perpendicular to bending axis $A_1$ (embodiment A) or the faces parallel to bending axis $A_1$ (embodiment B). It is noted that the frequency will be much more quantitatively influenced by a coating added to the faces parallel to bending axis $A_1$ (embodiment B) than by a coating added to the faces perpendicular to bending axis $A_1$ (embodiment A). We therefore deduce that depending upon the adjustment to be made between the balance spring and the balance to form the resonator, one of embodiments A, B, C, D and E will be more advantageous than the others.

The study carried out for the {100} plane of the wafer was also carried out for the {111} plane. Thus, FIG. 14 is a complete diagram of the calculations carried out for a strip formed in a single crystal silicon wafer cut along the {111} planes.

Figure 14:
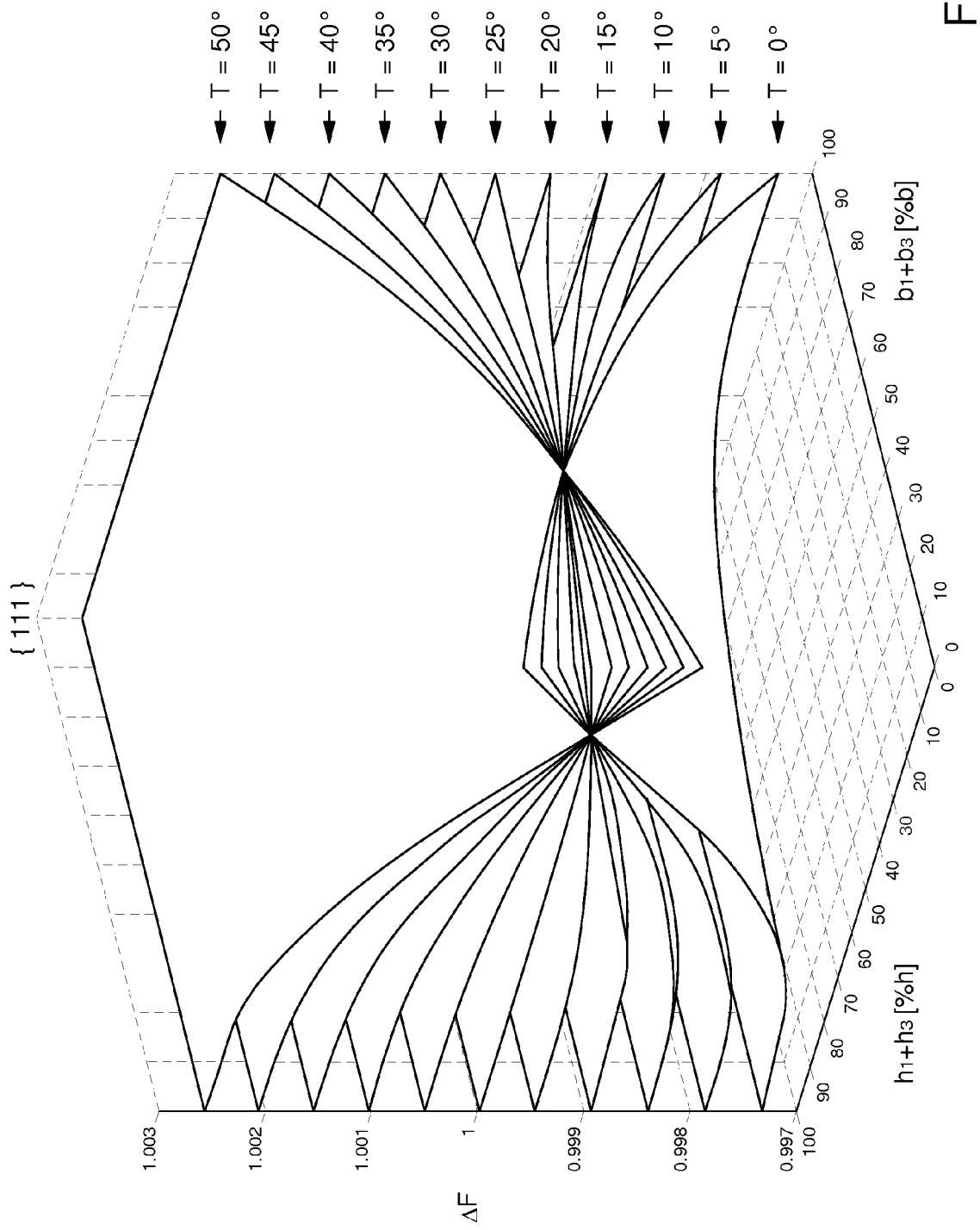
FIG. 14 is a diagram of the frequency variation of the resonator whose core is derived from the {111} plane of a single crystal silicon as a function of its temperature and coating thicknesses.

FIG. 14 shows the frequency variation for a resonator whose strip is derived from the {111} plane of single crystal silicon as a function of temperature and coating thicknesses. It can be seen that there is also a convergence curve between the various thermal planes allowing an approximately constant ratio ΔF to be maintained, i.e. equal to 1. To illustrate the characteristic curves more clearly, the following plans are given: a vertical plan of a part of FIG. 14 in the direction of axis $b_1+b_3$ [%b], i.e. %h=0 (FIG. 15), another in the direction of axis $h_1+h_3$ [%h], i.e. %b=0 (FIG. 16), then finally, a horizontal plan of FIG. 14 in the direction ΔF=1 (FIG. 17) have been formed.

Figure 15:
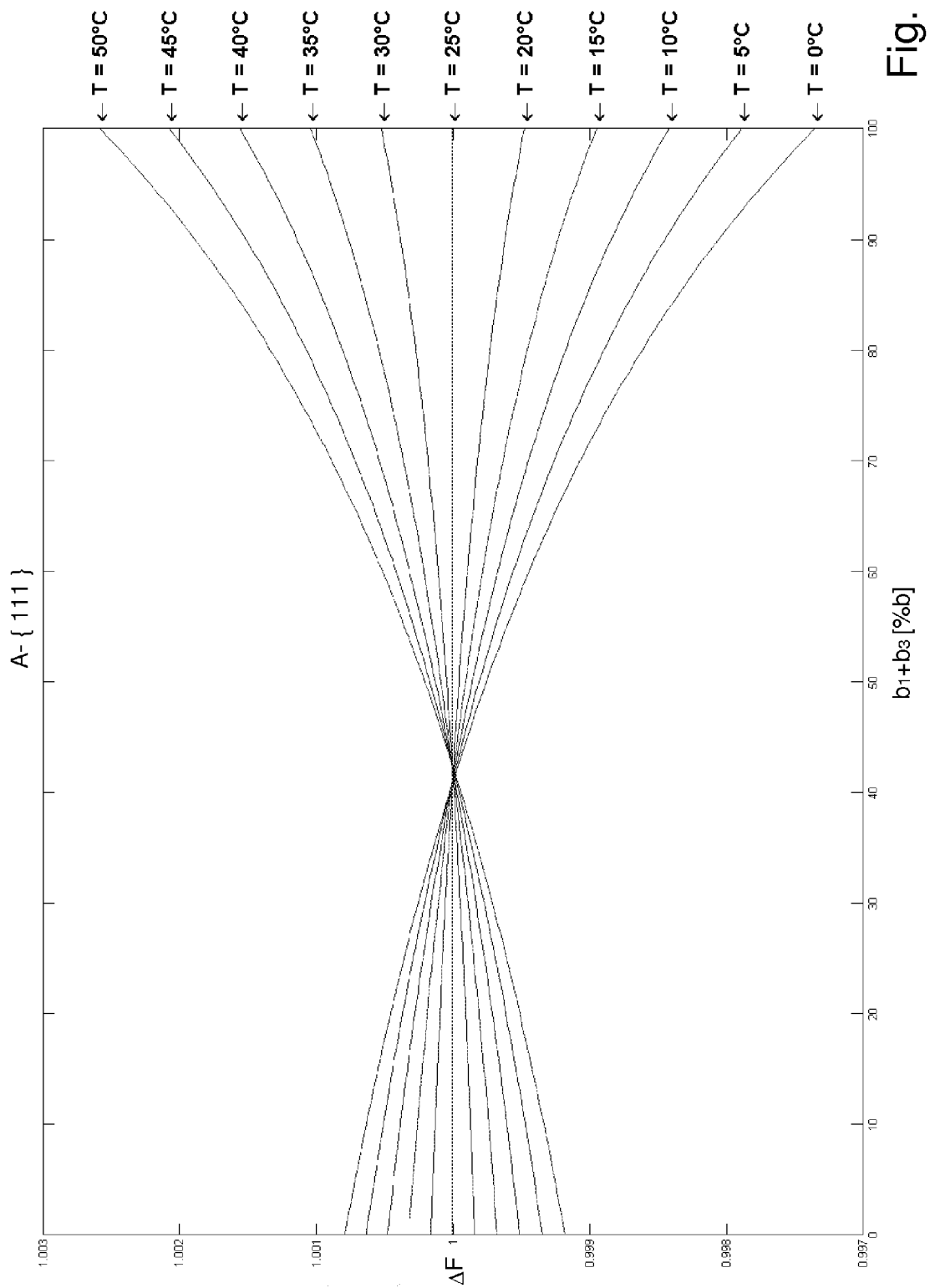
FIG. 15 is a vertical diagram of a part of FIG. 14 in the direction of axis $b_1+b_3$ [%b]

FIG. 15, which is actually the thermocompensation curve of the first embodiment A of FIG. 3, shows that the thermal curves converge on the 25° C. curve at percentage $b_1+b_3$ relative to b comprised between approximately 41 and 43%. For our preferred case wherein each opposite face observes the relation $b_1=b_3$, we thus have a coating thickness for embodiment A, for each of the two faces, of between 20.5 and 21.5%. After a more detailed calculation, the value $b_1+b_3$ is estimated at around 41.69%.

Figure 16:
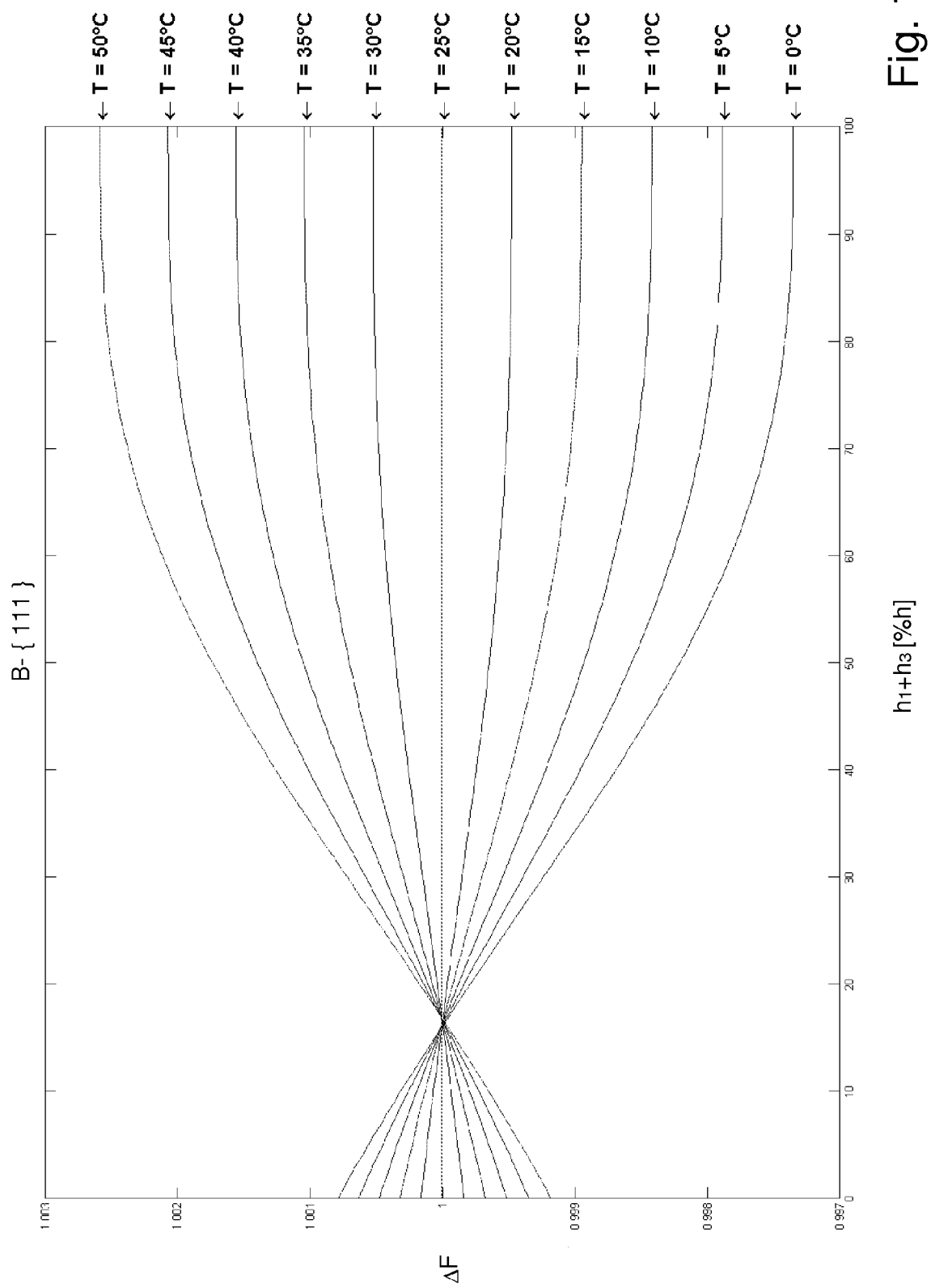
FIG. 16 is a vertical diagram of a part of FIG. 14 in the direction of axis $h_1+h_3$ [%h]

Similarly, with reference to FIG. 16, which is the thermocompensation curve of the second embodiment B of FIG. 3, it can be seen that the thermal curves converge on the 25° C. curve at percentage $h_1+h_3$ relative to h comprised between approximately 16 and 17%. For our preferred case wherein each opposite face observes the relation $h_1=h_3$, we thus have a coating thickness for second embodiment B, for each of the two faces, of between 8 and 8.5%. After a more detailed calculation, the value $h_1+h_3$ is estimated at around 16.46%.

Figure 17:
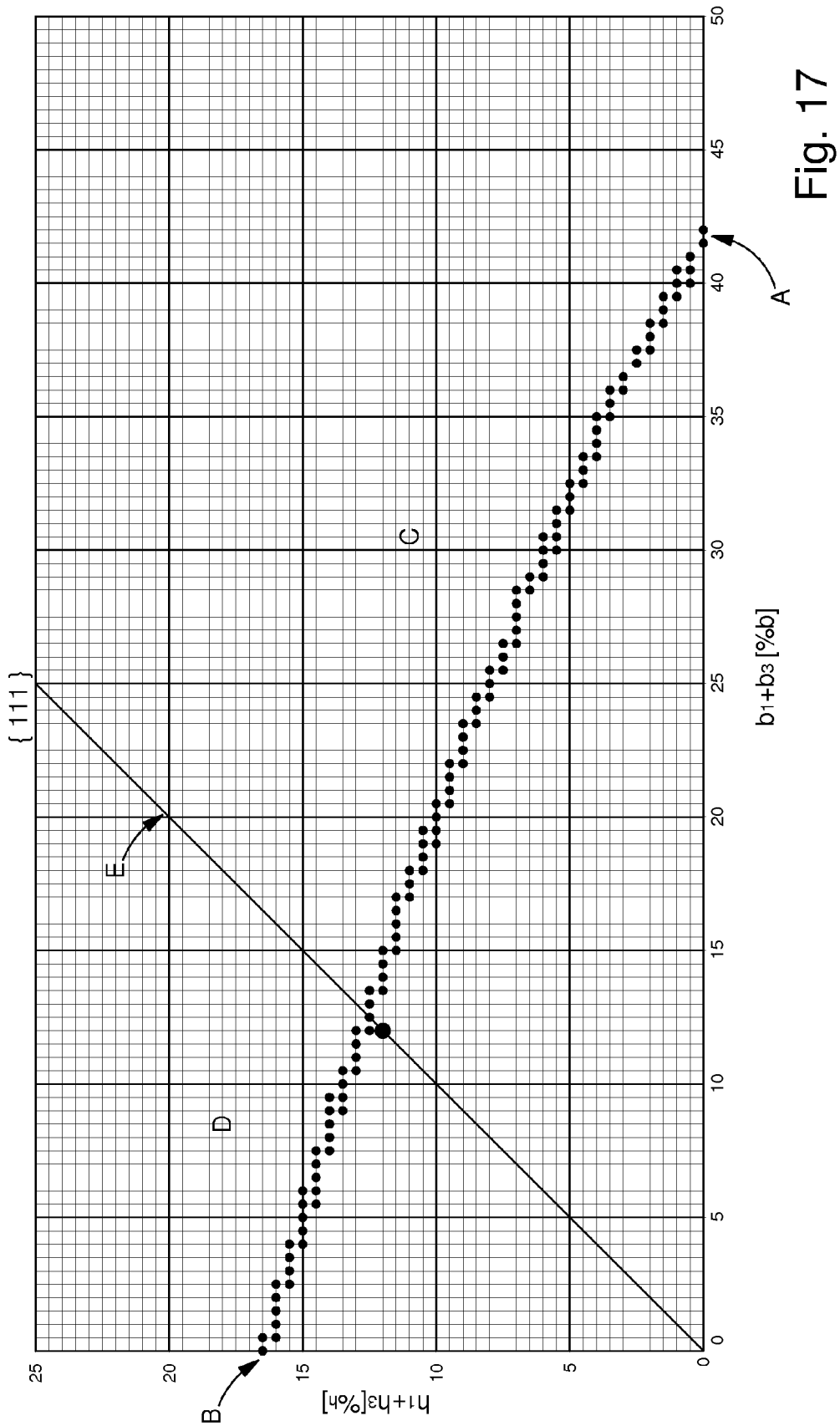
FIG. 17 is a horizontal diagram of a part of FIG. 14 in the direction $\Delta F=1$.

FIG. 17 summarizes the curve to be observed to compensate a strip formed of a single crystal silicon wafer cut along the {111} plane with amorphous silicon dioxide ($SiO_2$) coatings. Thus, the values of the first and second embodiments A and B are found again respectively on the x and y axes. Moreover, there is also an annotated curve E for which the same percentage is applied across all of the faces of the strip, i.e. as in EP Patent No. 1 422 436. Finally, it can be seen that the characteristic curve between point B and curve E belongs to the fourth embodiment D of FIG. 3 and, between curve E and point A, to the third embodiment C of FIG. 3.

To simplify determination of the layers to be formed, a cubic polynomial was calculated to make it easier to develop the resonator:

$$Y = A \cdot X^3 + B \cdot X^2 + C \cdot X + D$$

Where:
Y is the percentage of coating thickness ($h_1+h_3$) on the faces parallel to the strip bending axis ($A_1$) relative to the total strip height (h);
X is the percentage of coating thickness ($b_1+b_3$) on the faces perpendicular to the strip bending axis ($A_1$) relative to the total base (b) of the strip;
A is the cubic coefficient of the polynomial estimate of the characteristic curve which is $-3.5565 \cdot 10^{-5}$;
B is the quadratic coefficient of the polynomial estimate of the characteristic curve which is $-1.0642 \cdot 10^{-3}$;
C is the linear coefficient of the polynomial estimate of the characteristic curve which is $-0.28721$;
D is the unit of the polynomial estimate of the characteristic curve which is $16.446$.

We therefore deduce that, as for the {100} cutting plane, depending upon the adjustment to be made between the balance spring obtained from the {111} cutting plane of single crystal silicon and the balance (inertia fly wheel) to form the resonator, one of embodiments A, B, C, D, E will be preferred to the others. It is thus noted, as previously, that the choice between cutting planes {100} or {111} does not have a determining influence.

In light of the above explanation, it is thus clear that the teaching disclosed allows other types of thermocompensated mechanical resonators to be made, such as, for example, tuning fork or MEMS type resonators.

What is claimed is:

1. A thermocompensated mechanical resonator comprising:
   (a) a strip wound around itself to form at least one coil; and
   (b) a core disposed in the strip,
   wherein the core has a polygonal section and includes a single crystal silicon and a plurality of faces,
   wherein the core further includes, on at least one of the faces thereof, a coating for making the resonator less sensitive to temperature variations, and
   wherein at least one face of the core has no coating.

2. The resonator according to claim 1, wherein a section of the strip is a quadrilateral that has faces in identical pairs.

3. The resonator according to claim 1, wherein the coating is deposited with priority given to those faces of the core parallel to a bending plane of the strip, so as to improve quantitatively an influence of the coating on a frequency of the resonator.

4. The resonator according to claim 1, wherein the coating includes silicon dioxide.

5. The resonator according to claim 1, wherein the strip is coupled to an inertia fly wheel.

6. The resonator according to claim 1, wherein the core is made from a {100} single crystal silicon wafer.

7. The resonator according to claim 1, wherein the core is made from a {111} single crystal silicon wafer.

8. A thermocompensated mechanical resonator comprising:
   (a) a strip wound around itself to form at least one coil; and
   (b) a core disposed in the strip,
   wherein the core has a polygonal section and includes a single crystal silicon and a plurality of faces,
   wherein the core further includes, on at least one of the faces thereof, a coating for making the resonator less sensitive to temperature variations, and
   wherein at least one face of the core has no coating,
   wherein the strip is coupled to an inertia fly wheel, and
   wherein the coating thickness of the pairs of faces approximately follows the relation $$Y = A \cdot X^3 + B \cdot X^2 + C \cdot X + D,$$

wherein
Y is the percentage of coating thickness on those faces parallel to a bending axis $A_1$ of the strip relative to a total strip height h;

X is the percentage of coating thickness on those faces perpendicular to the bending axis $A_1$ of the strip relative to a total base b of the strip;

A is the cubic coefficient of a polynomial estimate of a characteristic curve, wherein A is $-3.5302 \cdot 10^{-5}$;

B is the quadratic coefficient of the polynomial estimate of the characteristic curve, wherein B is $-1.114 \cdot 10^{-3}$;

C is the linear coefficient of the polynomial estimate of the characteristic curve, wherein C is $-0.29152$; and D is the unit of the polynomial estimate of the characteristic curve, wherein the polynomial estimate of the characteristic curve is 15.522.

9. A thermocompensated mechanical resonator comprising:
(a) a strip wound around itself to form at least one coil; and
(b) a core disposed in the strip,
wherein the core has a polygonal section and includes a single crystal silicon and a plurality of faces,
wherein the core further includes, on at least one of the faces thereof, a coating for making the resonator less sensitive to temperature variations, and
wherein at least one face of the core has no coating,
wherein the strip is coupled to an inertia fly wheel, and
wherein the coating thickness of the at least one pairs of faces approximately follows the relation $$Y = A \cdot X^3 + B \cdot X^2 + C \cdot X + D,$$

wherein
Y is the percentage of coating thickness on those faces parallel to a bending axis $A_1$ of the strip relative to a total strip height h;
X is the percentage of coating thickness on those faces perpendicular to the bending axis $A_1$ of the strip relative to a total base b of the strip;
A is the cubic coefficient of a polynomial estimate of a characteristic curve, wherein A is $-3.5565 \cdot 10^{-5}$;
B is the quadratic coefficient of the polynomial estimate of the characteristic curve, wherein B is $-1.0642 \cdot 10^{-3}$;
C is the linear coefficient of the polynomial estimate of the characteristic curve, wherein C is $-0.28721$; and
D is the unit of the polynomial estimate of the characteristic curve, wherein the polynomial estimate of the characteristic curve is 16.446.

10. A thermocompensated resonator comprising:
(a) a strip wound around itself to form at least one coil; and
(b) a polygonal core disposed in the strip,
wherein the core has a polygonal section and includes a single crystal silicon and is coated with a coating for making the resonator less sensitive to temperature variations,
wherein at least two adjacent faces of the core are not coated with the same thickness of the coating.

11. The resonator according to claim 10, wherein the section of the strip is a quadrilateral whose faces are arranged in identical pairs.

12. The resonator according to claim 10, wherein the coating is deposited with priority given to those faces parallel to a bending plane of the strip, so as to improve quantitatively an influence of the coating on a frequency of the resonator.

13. The resonator according to claim 10, wherein the coating includes silicon dioxide.

14. The resonator according to claim 10, wherein the strip is coupled to an inertia fly wheel.

15. The resonator according to claim 10, wherein the core is made from a {100} single crystal silicon wafer.

16. The resonator according to claim 10, wherein the core is made from a {111} single crystal silicon wafer.

17. A thermocompensated resonator comprising:
(a) a strip wound around itself to form at least one coil; and
(b) a core disposed in the strip,
wherein the core has a polygonal section and includes a single crystal silicon and is coated with a coating for making the resonator less sensitive to temperature variations,
wherein at least two adjacent faces of the core are not coated with the same thickness of the coating,
wherein the strip is coupled to an inertia fly wheel, and
wherein the coating thickness of the pairs of faces approximately follows the relation $$Y = A \cdot X^3 + B \cdot X^2 + C \cdot X + D,$$

wherein
Y is the percentage of coating thickness on those faces parallel to a bending axis $A_1$ of the strip relative to a total strip height h;
X is the percentage of coating thickness on those faces perpendicular to the bending axis $A_1$ of the strip relative to a total base b of the strip;
A is the cubic coefficient of the polynomial estimate of a characteristic curve, wherein A is $-3.5302 \cdot 10^{-5}$;
B is the quadratic coefficient of the polynomial estimate of the characteristic curve, wherein B is $-1.114 \cdot 10^{-3}$;
C is the linear coefficient of the polynomial estimate of the characteristic curve, wherein C is $-0.29152$; and
D is the unit of the polynomial estimate of the characteristic curve, wherein the polynomial estimate of the characteristic curve is 15.522.

18. A thermocompensated resonator comprising:
(a) a strip wound around itself to form at least one coil; and
(b) a core disposed in the strip,
wherein the core has a polygonal section and includes a single crystal silicon and is coated with a coating for making the resonator less sensitive to temperature variations,
wherein at least two adjacent faces of the core are not coated with the same thickness of the coating,
wherein the strip is coupled to an inertia fly wheel, and
wherein the coating thickness of the pairs of faces approximately follows the relation $$Y = A \cdot X^3 + B \cdot X^2 + C \cdot X + D,$$

wherein
Y is the percentage of coating thickness on those faces parallel to a bending axis $A_1$ of the strip relative to a total strip height h;
X is the percentage of coating thickness on those faces perpendicular to the bending axis $A_1$ of the strip relative to a total base b of the strip;
A is the cubic coefficient of the polynomial estimate of a characteristic curve, wherein A is $-3.5565 \cdot 10^{-5}$;
B is the quadratic coefficient of the polynomial estimate of the characteristic curve, wherein B is $-1.0642 \cdot 10^{-3}$;
C is the linear coefficient of the polynomial estimate of the characteristic curve, wherein C is $-0.28721$; and
D is the unit of the polynomial estimate of the characteristic curve, wherein the polynomial estimate of the characteristic curve is 16.446.

19. A thermocompensated mechanical resonator comprising:
(a) a strip wound around itself to form at least one coil; and
(b) a core disposed in the strip,
wherein the core has a polygonal section and includes a single crystal silicon and a plurality of faces, wherein the core further includes, on at least one of the faces thereof, a coating for making the resonator less sensitive to temperature variations, and wherein at least one face of the core has no coating, wherein the core is made from a {100} single crystal silicon wafer, and wherein the coating thickness of the pairs of faces approximately follows the relation $$Y = A \cdot X^3 + B \cdot X^2 + C \cdot X + D,$$

wherein
- Y is the percentage of coating thickness on those faces parallel to a bending axis $A_1$ of the strip relative to a total strip height h;
- X is the percentage of coating thickness on those faces perpendicular to the bending axis $A_1$ of the strip relative to a total base b of the strip;
- A is the cubic coefficient of the polynomial estimate of a characteristic curve, wherein A is $-3.5302 \cdot 10^{-5}$;
- B is the quadratic coefficient of the polynomial estimate of the characteristic curve, wherein B is $-1.114 \cdot 10^{-3}$;
- C is the linear coefficient of the polynomial estimate of the characteristic curve, wherein C is $-0.29152$;
- D is the unit of the polynomial estimate of the characteristic curve, wherein the polynomial estimate of the characteristic curve is 15.522.

20. A thermocompensated mechanical resonator comprising:
(a) a strip wound around itself to form at least one coil; and
(b) a core disposed in the strip, wherein the core has a polygonal section and includes a single crystal silicon and a plurality of faces, wherein the core further includes, on at least one of the faces thereof, a coating for making the resonator less sensitive to temperature variations, and wherein at least one face of the core has no coating, wherein the core is made from a {111} single crystal silicon wafer, and wherein the coating thickness of the pairs of faces approximately follows the relation $$Y = A \cdot X^3 + B \cdot X^2 + C \cdot X + D,$$

wherein
- Y is the percentage of coating thickness on the faces parallel to the bending axis $A_1$ of the strip relative to the total strip height h;
- X is the percentage of coating thickness on those faces perpendicular to the bending axis $A_1$ of the strip relative to a total base b of the strip;
- A is the cubic coefficient of the polynomial estimate of a characteristic curve, wherein A is $-3.5565 \cdot 10^{-5}$;
- B is the quadratic coefficient of the polynomial estimate of the characteristic curve, wherein B is $1.0642 \cdot 10^{-3}$;
- C is the linear coefficient of the polynomial estimate of the characteristic curve, wherein C is $-0.28721$; and
- D is the unit of the polynomial estimate of the characteristic curve, wherein the polynomial estimate of the characteristic curve is 16.446.

21. A thermocompensated resonator comprising:
(a) a strip wound around itself to form at least one coil; and
(b) a core disposed in the strip, wherein the core has a polygonal section and includes a single crystal silicon and is coated with a coating for making the resonator less sensitive to temperature variations, wherein at least two adjacent faces of the core are not coated with the same thickness of the coating, wherein the core is made from a {100} single crystal silicon wafer, and wherein the coating thickness of the pairs of faces approximately follows the relation $$Y = A \cdot X^3 + B \cdot X^2 + C \cdot X + D,$$

wherein
- Y is the percentage of coating thickness on those faces parallel to a bending axis $A_1$ of the strip relative to a total strip height h;
- X is the percentage of coating thickness on those faces perpendicular to the bending axis $A_1$ of the strip relative to a total base b of the strip;
- A is the cubic coefficient of the polynomial estimate of a characteristic curve, wherein A is $-3.5302 \cdot 10^{-5}$;
- B is the quadratic coefficient of the polynomial estimate of the characteristic curve, wherein B is $-1.114 \cdot 10^{-3}$;
- C is the linear coefficient of the polynomial estimate of the characteristic curve, wherein C is $-0.29152$; and
- D is the unit of the polynomial estimate of the characteristic curve, wherein the polynomial estimate of the characteristic curve is 15.522.

22. A thermocompensated resonator comprising:
(a) a strip wound around itself to form at least one coil; and
(b) a core disposed in the strip, wherein the core has a polygonal section and includes a single crystal silicon and is coated with a coating for making the resonator less sensitive to temperature variations, wherein at least two adjacent faces of the core are not coated with the same thickness of the coating, wherein the core is made from a {111} single crystal silicon wafer, wherein the coating thickness of the pairs of faces approximately follows the relation $$Y = A \cdot X^3 + B \cdot X^2 + C \cdot X + D,$$

wherein
- Y is the percentage of coating thickness on those faces parallel to a bending axis $A_1$ of the strip relative to a total strip height h;
- X is the percentage of coating thickness on those faces perpendicular to the bending axis $A_1$ of the strip relative to a total base b of the strip;
- A is the cubic coefficient of the polynomial estimate of a characteristic curve, wherein A is $-3.5565 \cdot 10^{-5}$;
- B is the quadratic coefficient of the polynomial estimate of the characteristic curve, wherein B is $-1.0642 \cdot 10^{-3}$;
- C is the linear coefficient of the polynomial estimate of the characteristic curve, wherein C is $-0.28721$; and
- D is the unit of the polynomial estimate of the characteristic curve, wherein the polynomial estimate of the characteristic curve is 16.446.

* * * * *